United States Patent [19]

Ando et al.

[11] Patent Number: 4,943,729
[45] Date of Patent: Jul. 24, 1990

[54] ELECTRON BEAM LITHOGRAPHY SYSTEM

[75] Inventors: Kimiaki Ando, Nishitama; Mitsuo Ooyama, Hachioji; Norio Saitou, Iruma, all of Japan

[73] Assignee: Hitachi, Ltd., Tokyo, Japan

[21] Appl. No.: 284,733

[22] Filed: Dec. 15, 1988

[30] Foreign Application Priority Data

Dec. 18, 1987 [JP] Japan .................. 62-318808

[51] Int. Cl.$^5$ ............................................. H01J 37/30
[52] U.S. Cl. .................................. 250/492.3; 250/398
[58] Field of Search .................. 250/492.24, 492.22, 250/492.2, 398

[56] References Cited

U.S. PATENT DOCUMENTS 4,520,269 5/1985 Jones .......................... 250/492.22

FOREIGN PATENT DOCUMENTS

59-167018 9/1984 Japan .

Primary Examiner—Bruce C. Anderson
Attorney, Agent, or Firm—Antonelli, Terry, Stout & Kraus

[57] ABSTRACT

An electron beam lithography system having a contour resolving circuit for resolving original pattern data which is transferred from a host computer into contour portion pattern data and inner portion pattern data in accordance with the designated dimension, for adding flag data to enable the contour portion pattern data and the inner portion pattern data to be discriminated to the resolved pattern data, and for outputting the resolved pattern data with the flag data. By adding the flag data, the contour portion pattern data and inner portion pattern data can be easily discriminated. The operation to change the electron beam irradiation dose in accordance with the contour portion pattern and inner portion pattern can be fairly easily executed. A pattern can be drawn at a high accuracy while preventing a deformation of the drawn figure due to the proximity effect. A data processing amount in the computer can be reduced. A data transfer amount from the host computer can be also reduced. Thus, an electron beam lithography system having a high throughput can be realized.

5 Claims, 5 Drawing Sheets

| RESOLVING SEQUENCE | PATTERN NO. | S | F | X | Y | W | W' | H | H' |
|---|---|---|---|---|---|---|---|---|---|
| 1 | 301 | $S_i = S_o$ | $F_i = $ "1" | $X_i = X_o + 0 = X_o$ | $Y_i = Y_o + 0 = Y_o$ | $W_i = W_o = W_o$ | $W'_i = W_o - 0 = W_o$ | $H_i = H_o = H_o$ | $H'_i = H_o - 0 = H_o$ |

| RESOLVING SEQUENCE | PATTERN NO. | S | F | X | Y | W | W' | H | H' |
|---|---|---|---|---|---|---|---|---|---|
| 1 | 401 | $S_1 = S_0$ | $F_1 =$ "1" | $X_1 = X_0 + 0 = X_0$ | $Y_1 = Y_0 + 0 = Y_0$ | $W_1 = \ell = \ell$ | $W'_1 = W_0 - \ell = W_0 - \ell$ | $H_1 = H_0 = H_0$ | $H'_1 = H_0 - 0 = H_0$ |
| 2 | 402 | $S_2 = S_0$ | $F_2 =$ "1" | $X_2 = X_0 + W'_1 = X_0 + W_0\ell$ | $Y_2 = Y_0 + 0 = Y_0$ | $W_2 = \ell = \ell$ | $W'_2 = W'_1 - \ell = W_0 - 2\ell$ | $H_2 = H'_1 = H_0$ | $H'_2 = H'_1 - 0 = H_0$ |
| 3 | 403 | $S_3 = S_0$ | $F_3 =$ "1" | $X_3 = X_0 + \ell = X_0 + \ell$ | $Y_3 = Y_0 + 0 = Y_0$ | $W_3 = W'_2 = W_0 - 2\ell$ | $W'_3 = W'_2 - 0 = W_0 - 2\ell$ | $H_3 = \ell = \ell$ | $H'_3 = H_2 - \ell = H_0 - \ell$ |
| 4 | 404 | $S_4 = S_0$ | $F_4 =$ "1" | $X_4 = X_0 + \ell = X_0 + \ell$ | $Y_4 = Y_0 + H_3 = Y_0 + H_0 - \ell$ | $W_4 = W_3 = W_0 - 2\ell$ | $W'_4 = W'_3 - 0 = W_0 - 2\ell$ | $H_4 = \ell = \ell$ | $H'_4 = H'_3 - \ell = H_0 - 2\ell$ |
| 5 | 405 | $S_5 = S_0$ | $F_5 =$ "0" | $X_5 = X_0 + \ell = X_0 + \ell$ | $Y_5 = Y_0 + \ell = Y_0 + \ell$ | $W_5 = W'_4 = W_0 - 2\ell$ | $W'_5 = W'_4 - 0 = W_0 - 2\ell$ | $H_5 = H'_4 = H_0 - 2\ell$ | $H'_5 = H'_4 - 0 = H_0 - 2\ell$ | ns with refer-
ence to the accompanying drawings.

ELECTRON BEAM LITHOGRAPHY SYSTEM

BACKGROUND OF THE INVENTION

The present invention relates to an improvement of an electron beam lithography system and, more particularly, to an improved electron beam lithography system which can draw a pattern to be drawn at a high accuracy and at a high speed.

In an electron beam lithography apparatus, there has been known a method whereby in order to reduce a deformation of a pattern due to a well-known "proximity effect", a pattern to be drawn is resolved into a contour pattern portion and an inner pattern portion and an irradiation dose of an electron beam is changed in dependence on the contour portion pattern and the inner portion pattern, thereby drawing a pattern at a high accuracy (for instance, refer to JP-A-59-167018).

However, in the foregoing conventional method, the process to resolve the data of a pattern to be drawn into the contour portion pattern data and the inner portion pattern data (such a process is called a contour resolving process) is realized by a software in a large scale computer provided separately from a control computer for controlling the whole electron beam lithography apparatus. Therefore, an amount of data to be processed for contour resolution by the large scale computer is very large and it takes a long time to transfer the resolved pattern data to the lithography apparatus, so that the drawing speed becomes slow. As mentioned above, according to the conventional method, although a pattern can be drawn at a high precision, there is a problem such that a throughput as a lithography apparatus remarkably deteriorates.

SUMMARY OF THE INVENTION

It is an object of the present invention to provide an electron beam lithography system in which a pattern to be drawn can be drawn at a high accuracy and at a high speed.

To accomplish the above object, the present invention has a feature such that circuit means for resolving data of an original pattern to be drawn into contour portion pattern data and inner portion pattern data is provided not in the side of a computer but in the side of lithography apparatus. Thus, an amount of data to be processed by the computer is reduced and an amount of data to be transferred from the computer to the lithography apparatus side is reduced, thereby enabling a throughput as a lithography apparatus to be remarkably improved while keeping an advantage such that a pattern is drawn at a high precision.

The invention has another important feature such that the circuit means (contour resolving circuit) for resolving the original pattern data into the contour portion pattern data and the inner portion pattern data adds a flag to discriminate whether the pattern data is the contour portion pattern data or the inner portion pattern data to at least either one of the contour portion pattern data and the inner portion pattern data which are obtained from the original pattern data by the pattern resolving process and outputs the resolved pattern data with the flag. By checking the flag, when drawing, an exposure dose (irradiation amount of an electron beam) can be changed in accordance with the contour portion pattern and the inner portion pattern.

The above and other objects and features of the present invention will become apparent from the following detailed description and the appended claims with reference to the accompanying drawings.

DESCRIPTION OF THE PREFERRED EMBODIMENT

An embodiment of the present invention will be described in detail hereinbelow with reference to the drawings.

Prior to practically describing the embodiment, the definition of the pattern and method of the contour resolution according to the present invention will be first explained.

Figure 3A:
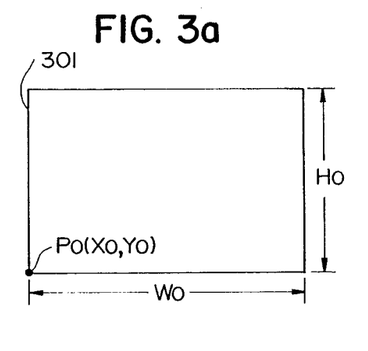
FIGS. 3a and 3b are explanatory diagrams showing the corresponding relation between an original pattern to be drawn and original pattern data.
Figure 3B:
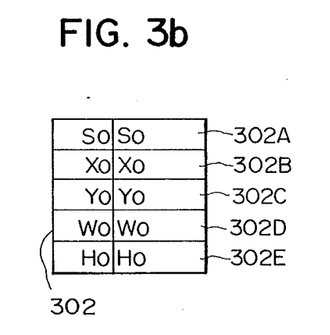

FIG. 3a shows an original pattern 301 to be drawn and FIG. 3b the pattern data 302 thereof. On the original pattern data 302, the original pattern 301 is expressed by five data words consisting of: a data word 302A indicative of the kind of pattern (the pattern sort) $S_0$ (rectangle in this case) of the original pattern; data words 302B and 302C respectively indicative of the coordinates $X_0$ and $Y_0$ of the reference position $P_0$ of the original pattern; and data words 302D and 302E respectively indicative of the width $W_0$ and the height $H_0$ of the original pattern.

Figures 4A, 4B:
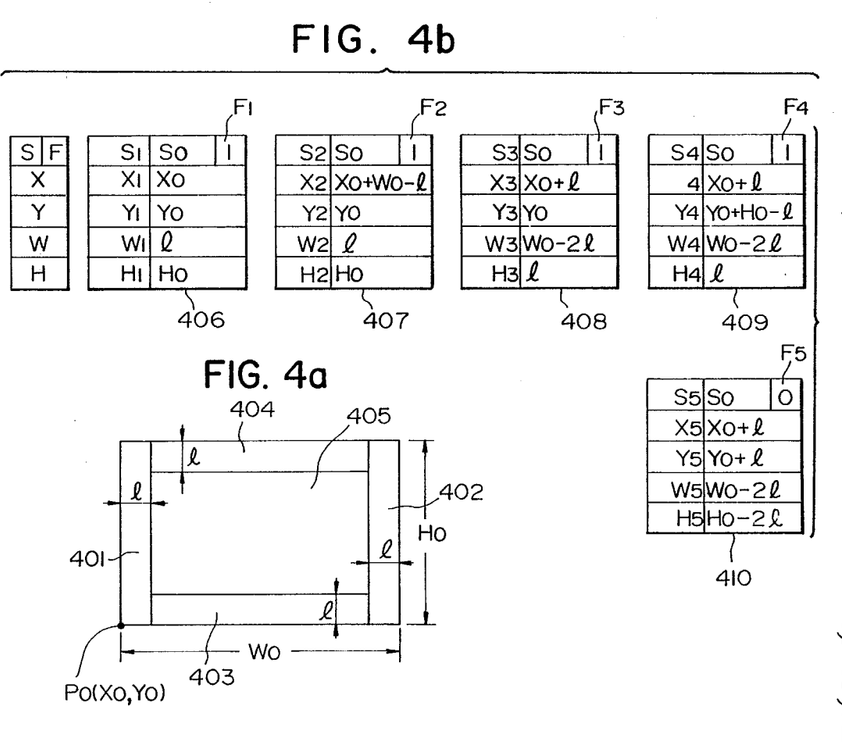
FIGS. 4a and 4b are explanatory diagrams showing the relations among the patterns obtained by a contour resolution by the contour resolving circuit and the pattern data corresponding thereto.

FIG. 4a shows resolved patterns 401 to 405 which are obtained by the contour resolution by the contour resolving circuit according to the invention and FIG. 4b shows resolved pattern data 406 to 410 corresponding to the resolved patterns. As shown in FIG. 4a in the contour resolution process, an original pattern is resolved into the contour portion patterns 401 to 404 each having a width l and the remaining inner portion pattern 405 in accordance with the resolving dimension l designated. The contour resolving circuit resolves the original pattern in the following order. The contour portion patterns 401 to 404 are first divided and as shown in FIG. 4b the pattern data 406 to 409 corresponding thereto are output. Finally, the pattern data 410 corresponding to the remaining inner portion pattern 405 is output as shown in FIG. 4b. The output pattern data (after resolving) is expressed by five data words indicative of a pattern sort S, an X coordinate X and a Y coordinate Y of a reference point, a width W, and a height H of each resolved pattern. A flag F ($F_1$ to $F_5$) to discriminate whether the pattern data is of the contour portion pattern or of the inner portion pattern is added to a part of the data word indicative of each of the pattern sort data S. For instance, the flag F is set to "1" in the case of the contour portion pattern data and to "0" in the case of the inner portion pattern data.

The embodiment of the invention will now be described hereinbelow.

Figure 1:
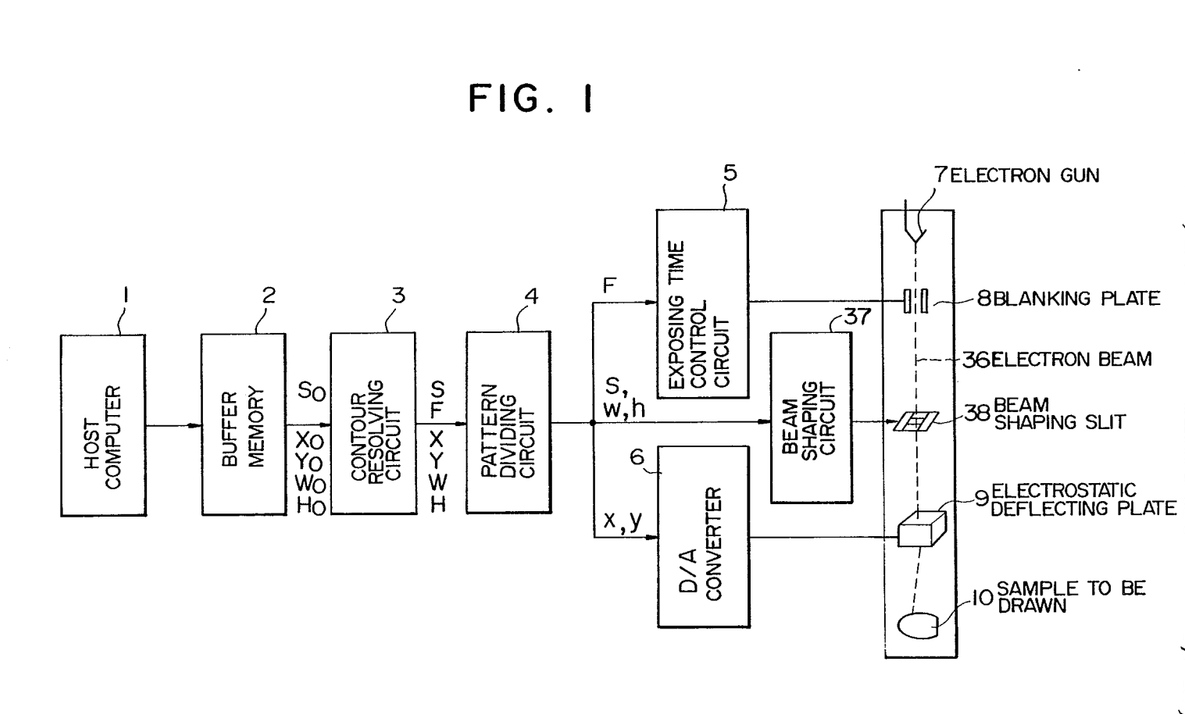
FIG. 1 is a block diagram showing a system arrangement of an electron beam lithography system according to an embodiment of the present invention.

FIG. 1 is a block diagram showing a system arrangement of an electron beam lithography system having a contour resolving circuit according to the invention.

In FIG. 1, reference numeral 1 denotes a host computer to control the whole lithography system and to transmit original pattern data to be drawn to the lithography apparatus side; 2 indicates a buffer memory to store the original pattern data to be drawn; 3 a contour resolving circuit to resolve the original pattern data to be drawn into contour portion pattern data and inner portion pattern data in accordance with the invention and to output; 4 a pattern deviding circuit to further divide each of the resolved pattern data into unit pattern data of the size of a shaped electron beam (the maximum projection spot size) or less; 5 an exposing time control circuit for changing an exposing time in accordance with the contour portion pattern and inner portion pattern; 6 a D/A converter to convert the x and y data (digital data) regarding each of the devided unit pattern into deflecting voltages of an electron beam; 7 an electron gun; 8 a beam blanking plate; 9 an electrostatic deflecting plate to deflect the electron beam in accordance with the deflecting voltages; 10 a sample to be drawn (for instance, semiconductor wafer); 36 an electron beam; 37 a beam shaping circuit; and 38 a beam shaping slit.

In the system arrangement, the drawing operation will be executed in the following manner.

The pattern data 302 of the original pattern 301 to be drawn is transferred from the host computer 1 to the buffer memory 2 and stored therein. When the execution of the drawing operation is instructed from the host computer 1, the original pattern data 302 stored in the buffer memory 2 is resolved into the contour portion pattern data 406 to 409 and the inner portion pattern data 410 by the contour resolving circuit 3. The flag F ($F_1$ to $F_5$) to discriminate the contour portion pattern data and the inner portion pattern data is added to each of the resolved pattern data and the resultant data is output. Each of the resolved pattern data 406 to 410 is further subsequently divided into the data of plurality of unit patterns each having a size equal to the maximum projection spot size or less of a variable shaping electron beam by the pattern dividing circuit 4 and, thereafter, they are used to draw by the electron beam 36 (refer to FIG. 7).

A format of the input data (namely, original pattern data) 302 to the contour resolving circuit 3 is as shown in FIG. 3. A format of each of the output data 406 to 410 is as shown in FIG. 4b.

As shown in FIG. 4b, the contour resolving circuit 3 outputs five pattern data 406, 407, 408, 409, and 410. However, at that time, with respect to the contour portion pattern data 406, 407, 408, and 409, the flag portion data F ($F_1$ to $F_4$) corresponding thereto are set to "1" to thereby indicate that those pattern data are the contour portion pattern data. Then, the pattern data 406 to 409 with the "1" flags are output. For the inner portion pattern data 410, the flag portion data F ($F_5$) is set to "0" to thereby represent that the pattern data is the inner portion pattern data. Then, the pattern data 410 with the "0" flag is output.

Figure 7:
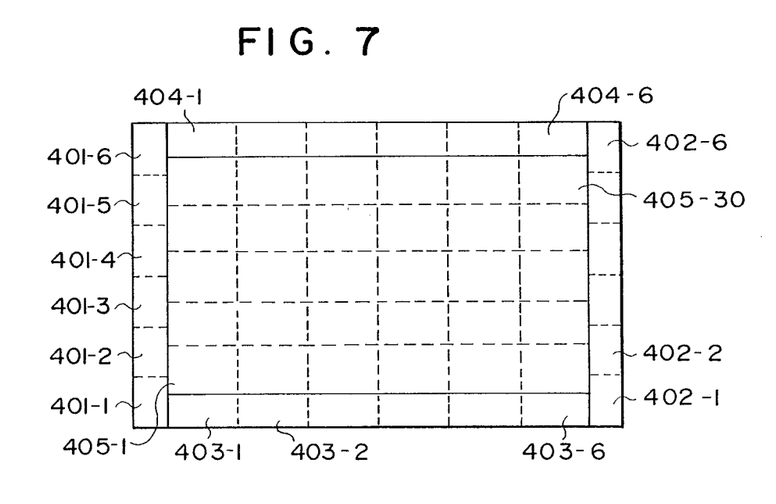
FIG. 7 is an explanatory diagram showing a state in which each of the resolved patterns obtained by contour resolution process is actually drawn.

The patterns resolved by the contour resolving circuit 3 are further divided into the unit patterns (401-1 to 401-5, 402-1 to 402-6, 403-1 to 403-6, 404-1 to 404-6, and 405-1 to 405-30 in FIG. 7) each having a size of the maximum projection spot size or less of the variable shaping electron beam by the pattern dividing circuit 4 with reference to the pattern sort data portions S ($S_1$ to $S_5$). The data portions indicative of S, w and h in the data corresponding to each of divided unit pattern are input to the beam shaping circuit 37 and used to control the size of beam spot by adjusting the beam shaping slit 38. On the other hand, the data portions indicative of x and y are converted into the electron beam deflecting voltages by the D/A converter 6. The deflecting voltages are applied to the electrostatic deflecting plate 9, thereby deflecting the electron beam 36. On the other hand, the flag data F which is provided to discriminate whether the pattern data is the contour portion pattern data or the inner portion pattern data and was added by the contour resolving circuit 3 is input to the exposing time control circuit 5. On the basis of the discrimination by the flag data F, the exposing time control circuit 5 controls a timing for a blanking voltage which is applied to the beam blanking plate 8 so as to set a long exposing time for the contour pattern portions and a short exposing time for the inner pattern portion. The difference between the exposing times for the contour portion patterns and inner portion pattern is properly set in consideration of a sensitivity of an electron beam resist which is used or the like.

As mentioned above, an irradiation dose of the electron beam is increased with respect to the contour portion patterns and is decreased with regard to the inner portion pattern and the exposure is executed, so that a deformation of the pattern due to the proximity effect can be prevented and the patterns can be drawn at a high precision. For this purpose as well, the flag data F has the significant role.

Figure 2:
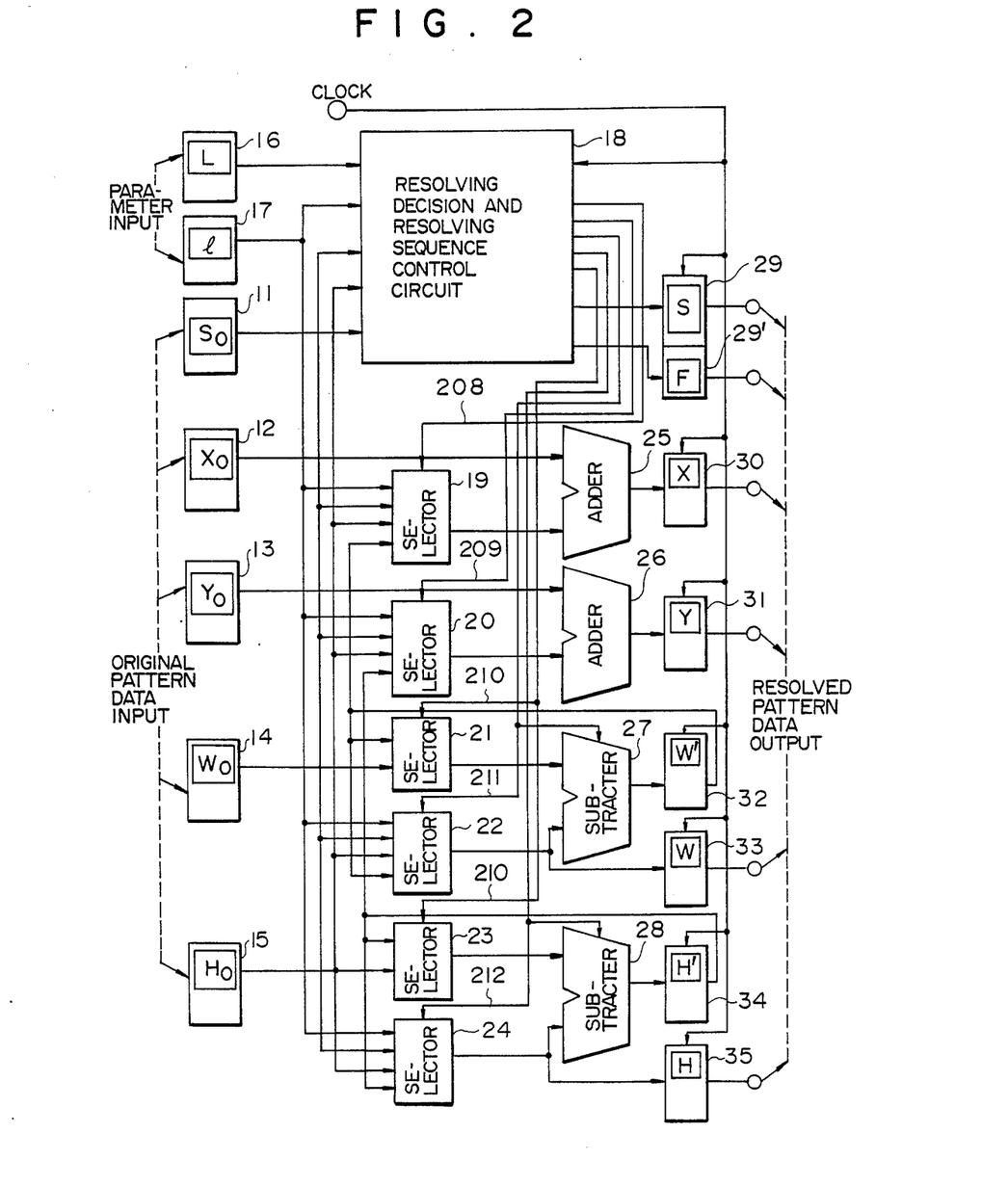
FIG. 2 is a block circuit diagram showing an example of a practical circuit arrangement of a contour resolving circuit in FIG. 1.

FIG. 2 is a diagram showing an example of a detailed arrangement of the contour resolving circuit 3. In FIG. 2, reference numerals 11, 12, 13, 14, and 15 denote input registers into which the original pattern data are input and stored. The pattern sort data $S_0$ is input and stored into the register 11; $X_0$ is into the register 12; $Y_0$ into the register 13; $W_0$ into the register 14; and $H_0$ into the register 15, respectively. Reference numerals 16 and 17 denote resolving parameter registers. The register 16 is called a resolving decision dimension register. Data L indicative of a reference value with respect to whether the contour resolving operation should be executed to which extent of pattern size or more or not is input and stored in the register 16 in order to prevent a pattern deformation due to the proximity effect. The register 17 is called a resolving dimension register. Data l indicative of a cutting-out width of the contour portion patterns in the case of executing the contour resolving operation is input and stored in the register 17. Reference numeral 18 denotes a circuit to perform the resolving decision and the resolving sequence control. The circuit 18 determines whether contour resolving operation should be executed or not on the basis of the resolving decision dimension L, resolving dimension l, width $W_0$ and height $H_0$ of the original pattern, and pattern sort data $S_0$. The circuit 18 also outputs control signals 208 to 212 to perform the sequence control for the resolving arithmetic operations. Further, the circuit 18 outputs the pattern sort data S and flag data F to a pattern sort data register 29 and a flag data register 29', respectively.

Reference numeral 19 denotes a 4-input data selector. By the control signal 208, the selector 19 selects either one of the four input data, that is, resolving dimension l, original pattern width $W_0$, original pattern height $H_0$, and result W' during the arithmetic operation of the pattern width W after resolving or selects "0" and outputs. Reference numeral 20 denotes a 4-input data selector. By the control signal 209, the selector 20 selects either one of the resolving dimension l, original pattern width $W_0$, original pattern height $H_0$, result H' during the arithmetic operation of the pattern height H after resolving, and "0" and outputs.

Reference numerals 21 and 23 denote 2-input data selectors. The selector 21 selects either one of the original pattern width $W_0$ and the result W' during the arithmetic operation of the resolving pattern width W by the control signal 210 and outputs. The other selector 23 selects either one of the original pattern height $H_0$ and the result H' during the arithmetic operation of the resolving pattern height H by the control signal 210 and outputs.

Reference numerals 22 and 24 denote 4-input data selectors. The selector 22 selects either one of the resolving dimension l, original pattern width $W_0$, original pattern height $H_0$, and result W' during the arithmetic operation of the resolving pattern width W by the control signal 211 and outputs. The other selector 24 selects either one of the resolving dimension l, original pattern width $W_0$, original pattern height $H_0$, and result H' during the arithmetic operation of the resolving pattern height H by the control signal 212 and outputs. Reference numeral 25 denotes an adder to add the X coordinate data $X_0$ of the reference point $P_0$ of the original pattern and the data value selected by the selector 19. Reference numeral 26 denotes an adder to add the Y coordinate data $Y_0$ of the original pattern and the data value selected by the selector 20. A subtracter 27 performs the subtraction between outputs of the selectors 21 and 22 or the arithmetic operation of the output of the selector 21 minus "0". A subtracter 28 executes the subtraction between outputs of the selectors 23 and 24 or the arithmetic operation of the output of the selector 23 minus "0".

Reference numerals 29, 29', 30, 31, 33, and 35 denote output registers of the pattern data after resolving. The register 29 stores the pattern sort data S. The register 29' stores the flag data F. The register 30 stores the data X. The register 31 stores the data Y. The register 33 stores the data W. The register 35 stores the data H.

Reference numerals 32 and 34 denote registers to temporarily hold the results W' and H' during the arithmetic operations of the W and H data.

An example of the contour resolving arithmetic operation by the contour resolving circuit in FIG. 2 will now be described hereinbelow with reference to FIGS. 3 to 6.

The data words $S_0$, $X_0$, $Y_0$, $W_0$, and $H_0$ constructing the original pattern data shown in FIG. 3 are input to the input registers 11, 12, 13, 14, and 15, respectively. The resolving decision dimension L and resolving dimension l are stored into the registers 16 and 17, respectively.

The circuit 18 determines whether the contour resolving operation should be executed or not on the basis of the resolving decision dimension L, resolving dimension l, pattern sort data $S_0$, original pattern width $W_0$, and original pattern height $H_0$. That is, the contour resolving operation is not executed when the width $W_0$ or height $H_0$ of the original pattern is smaller than the preset resolving decision dimension L. The input data $X_0$, $Y_0$, $W_0$, and $H_0$ are directly output to the output registers 30, 31, 33, and 35.

The arithmetic operations of the output data X, Y, W, and H are executed through the adders 25 and 26 and the subtracters 27 and 28 by controlling the selectors 19 to 24 on the basis of the control signal outputs 208 to 212 of the resolving sequence control circuit 18.

Figure 5:
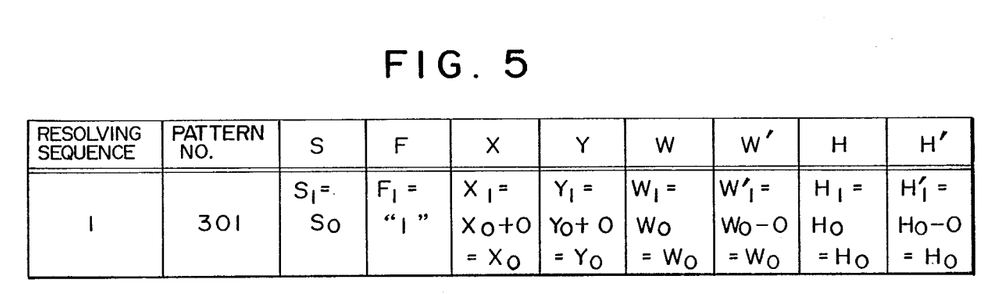
FIG. 5 is an explanatory diagram showing a method for arithmetic operating processes in the case where the contour resolving circuit does not execute contour resolution.

When the contour resolving operation is not executed, the output data X, Y, W, and H are derived by executing the following arithmetic operations (refer to FIG. 5).

The output data X is obtained as $X_1 = X_0$ by selecting "0" by the selector 19, adding to the input data $X_0$ by the adder 25, and outputting "$X_0+0$" to the output register 30.

The output data Y is obtained as $Y_1 = Y_0$ by selecting "0" by the selector 20, adding to the input data $Y_0$ by the adder 26, and outputting "$Y_0+0$" to the output register 31, in a manner similar to the case of X.

For the output data W, both of the selectors 21 and 22 select the input data $W_0$, and $W_0$ selected by the selector 22 is directly output to the output register 33 ($W_1 = W_0$). On the other hand, the arithmetic operation of "$W_0-0$" is executed by the subtractor 27 and the result is stored into the register 32 ($W_1' = W_0$).

For the output data H, in a manner similar to the case of W, both of the selectors 23 and 24 select the input data $H_0$, and $H_0$ selected by the selector 24 is directly output to the output register 35 ($H_1 = H_0$). On the other hand, the arithmetic operation of "$H_0-0$" is executed by the subtracter 28 and the result is output to the register 34 ($H_1' = H_0$).

The foregoing arithmetic operations when the contour resolving operation is not executed will be summarized in a table of FIG. 5. In such a case, the pattern sort data S is output as the pattern sort $S_0$ (rectangle) of the original pattern and the flag data F is output as "1". That is, with respect to the pattern data in the case where the contour resolving operation is not executed, the same flag "1" as that of the contour pattern portions in the case where the contour resolving operation was executed is added. The electron beam is exposed with the same electron beam irradiation dose as that in the case of the contour patterns.

On the other hand, whether the resolving operation should be executed or not is determined by the circuit 18. The contour resolving operation is executed when the resolving decision dimension L is equal to or larger than the width $W_0$ or height $H_0$ of the original pattern.

Figure 6:
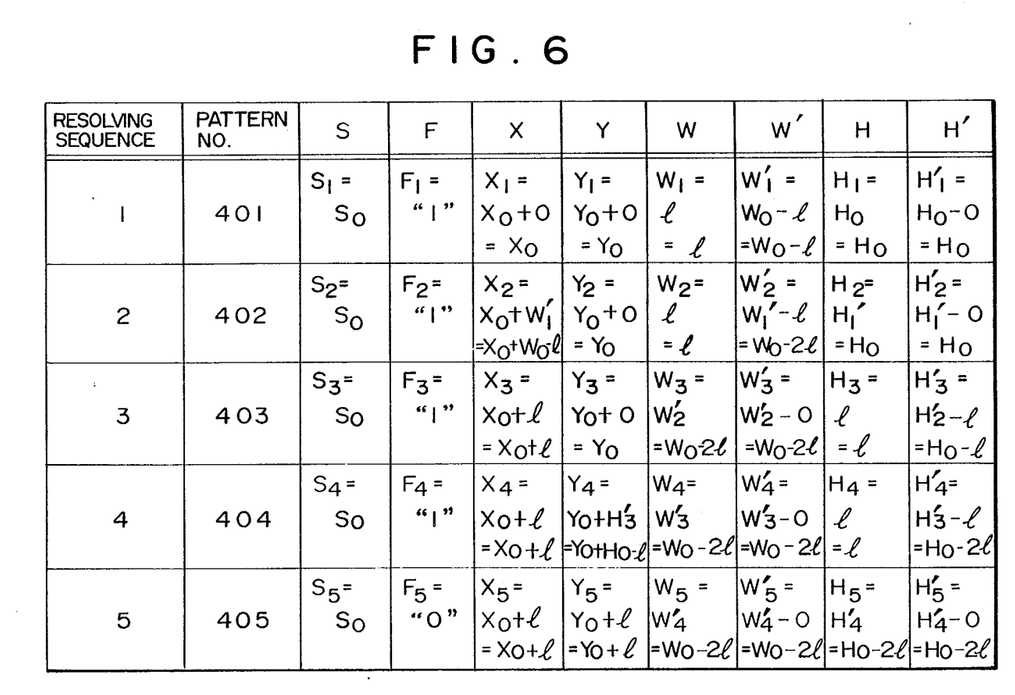
FIG. 6 is an explanatory diagram showing a method for arithmetic operating processes in the case where the contour resolving circuit executes contour resolution.

FIG. 6 shows an example of the arithmetic operations in the case of executing the contour resolving operation. The contour resolving arithmetic operations shown in FIG. 6 are the arithmetic operating equations of the patterns 401 to 405 in FIG. 4a, respectively.

In the case of contour resolving, the resolving sequence control circuit 18 controls so as to resolve one input original pattern data by five clock cycles of the resolving sequences 1 to 5.

In the resolving sequence 1 as the first sequence shown in FIG. 6, the pattern data of the contour pattern 401 in FIG. 4a is output.

Control signals for the resolving sequence 1 are output from the resolving sequence control circuit 18 to the signal lines 208, 209, 210, 211 and 212. Then, the contour resolving operation is executed as follows.

With respect to the output data X, "0" is selected by the selector 19, "$X_0+0$" is calculated by the adder 25, and the result is output to the output register 30 ($X_1=X_0$).

With regard to the output data Y, "0" is selected by the selector 20, "$Y_0+0$" is calculated by the adder 26, and the result is output to the output register 31 ($Y_1=Y_0$).

For the output data W, the content $W_0$ of the input register 14 is selected by the selector 21 and the content l of the resolving dimension register 17 is selected by the selector 22, respectively. Therefore, the data l selected by the selector 22 is directly output to the output register 33 ($W_1=l$). On the other hand, "$W_0-l$" is calculated by the subtracter 27. The result is stored into the register 32 ($W_1'=W_0-l$).

For the output data H, the content $H_0$ of the input register 15 is selected by the selectors 23 and 24, and $H_0$ selected by the selector 24 is directly input to the output register 35 ($H_1=H_0$). On the other hand, "$H_0-0$" is calculated by the subtracter 28 and the result is stored into the register 34 ($H_1'=H_0$).

The foregoing arithmetic operations are executed in one clock cycle. The data is output to each of the output registers. Then, the resolving sequence control circuit 18 executes the next sequence 2. Control signals to perform the arithmetic operations of the contour pattern 402 in FIG. 4a are output to the signal lines 208, 209, 210, 211, and 212. With respect to X, "$X_0+W_1'$" is calculated by the adder 25 through the selector 19. The data of "$X_0+W_0-l$" as the result of the arithmetic operation is stored into the output register 30 ($X_2=X_0+W_0-l$). With regard to Y, "$Y_0+0$" is calculated by the adder 26 through the selector 20 and the result $Y_0$ is stored into the output register 31 ($Y_2=Y_0$). With respect to W, l is selected by the selector 22 and l is stored into the output register 33 ($W_2=l$). At the same time, "$W_1'-l$" is calculated by the subtracter 27 through the selectors 21 and 22 and the value of "$W_0-2l$" as the result is stored into the register 32 ($W_2'=W_0-2l$). For H, $H_1'$ is selected by the selector 24 and the value of $H_0$ is stored into the output register 35 ($H_2=H_0$) At the same time, "$H_1'-0$" is calculated by the subtracter 28 through the selectors 23 and 24 and the value of $H_0$ as the result is stored into the register 34 ($H_2'=H_0$).

In a manner similar to the above, the contour resolving operation is executed by executing the arithmetic operations shown in FIG. 6 in the sequences 3 to 5. At that time, according to the invention, the flag to discriminate the contour portion pattern data and inner portion pattern data is added for every resolving sequence and the pattern data with the flag is output. That is, since the pattern data derived by executing the arithmetic operations in the resolving sequences 1 to 4 are the contour portion pattern data, the flags $F_1$ to $F_4$ are set to "1" and the pattern data with the "1" flags are output to the output register 29'. On the other hand, since the pattern data obtained by executing the arithmetic operations in the sequence 5 is the inner portion pattern data, the flag $F_5$ is set to "0" and the pattern data with the "0" flag is output to the output register 29'. Each of the flags has an important role as a discrimination flag to change the irradiation dose of the electron beam in accordance with the contour portion pattern and the inner portion pattern upon drawing. It is obviously sufficient to add the flag to either one of the contour portion pattern data and the inner portion pattern data.

As described above, the contour resolution is executed in five clock cycles and five resolved pattern data are output. That is, one resolved pattern data can be derived for every clock cycle.

FIG. 7 shows a pattern as the result in the case where the pattern data obtained by executing the contour resolving operation as shown in FIG. 4a was further resolved by the pattern dividing circuit 4 in FIG. 1. After the pattern data was divided into unit patterns smaller than the maximum spot size of the shaping electron beam as shown at 401-1 to 401-6 by the pattern dividing circuit 4, the pattern is drawn.

As will be obviously understood from the above description, according to the invention, the contour resolving operation is executed by the contour resolving circuit out of the host computer. Therefore, as compared with the case where the contour resolving operation is executed in the large scale computer as in the conventional apparatus, there are obtained advantages such that a data processing amount in the computer is remarkably reduced, a transfer amount of pattern data from the host computer is reduced to at most 1/5, the times required to process and transfer the data are fairly reduced, and the throughput can be extremely improved with a high drawing accuracy held as an electron beam lithography apparatus. Particularly, since a flag indicative of the contour portion pattern data or inner portion pattern data is added to each of the resolved pattern data, by making the electron beam irradiation dose differ in accordance with the contour portion pattern and inner portion pattern, the proximity effect can be easily prevented.

We claim:

1. An electron beam lithography system comprising contour resolving circuit means for resolving an input original pattern data into contour portion pattern data and inner portion pattern data in accordance with a designated dimension, flag means for adding flag data to the resolved pattern data to distinguish the contour portion pattern data from the inner portion pattern data, and means for outputting the resolved pattern data with the flag data.

2. An electron beam lithography system according to claim 1, further comprising:
   means for designating a minimum dimension of a pattern to be resolved;
   means for comparing the designated minimum dimension with the dimension of the original pattern; and
   means for directly outputting the original pattern data when the dimension of the original pattern is smaller than the designated minimum dimension.

3. An electron beam lithography system according to claim 2, further comprising means for adding flag data to the directly output original pattern data corresponding to the flag data added to the resolved pattern data by the flag means.

4. An electron beam lithography system according to claim 1, further comprising means for discriminating said flag data, and means for changing an exposure dose of an electron beam in accordance with the contour portion pattern and inner portion pattern.

5. An electron beam lithography system comprising:
a host computer to control the whole electron beam lithography system;
contour resolving circuit means including means for resolving original pattern data which is transferred from said host computer into contour portion pattern data and inner portion pattern data in accordance with a designated resolving decision dimension, means for adding flag data to discriminate the contour portion pattern data and the inner portion pattern data to the resolved pattern data, and means for outputting the resolved pattern data with said flag data; and
means for drawing including means for increasing an irradiation dose of an electron beam with respect to the contour portion pattern data which is output from said contour resolving circuit means, and means for relatively reducing the electron beam irradiation dose with respect to the inner portion pattern data as compared with the electron beam irradiation dose with respect to the contour portion pattern data.

* * * * *